United States Patent
Seo (10) Patent No.: US 9,570,127 B1
(45) Date of Patent: Feb. 14, 2017

(54) SEMICONDUCTOR MEMORY DEVICE WITH CUT-OFF VOLTAGE AND OPERATING METHOD THEREOF

(71) Applicant: SK hynix Inc., Icheon-si, Gyeonggi-do (KR)

(72) Inventor: Ji Hyun Seo, Seoul (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/134,615

(22) Filed: Apr. 21, 2016

(30) Foreign Application Priority Data

Nov. 23, 2015 (KR) .......................... 10-2015-0164006

(51) Int. Cl.
| | | |
|---|---|---|
| *G11C 16/04* | (2006.01) | |
| *G11C 7/18* | (2006.01) | |
| *G11C 5/02* | (2006.01) | |
| *G11C 16/10* | (2006.01) | |
| *G11C 16/30* | (2006.01) | |

(52) U.S. Cl.
CPC ................ *G11C 7/18* (2013.01); *G11C 5/025* (2013.01); *G11C 16/10* (2013.01); *G11C 16/30* (2013.01)

(58) Field of Classification Search
CPC ..... G11C 16/0483; G11C 16/10; G11C 16/30; G11C 2213/71; G11C 5/147
USPC ........ 365/185.18, 185.17, 185.14, 63, 189.09
See application file for complete search history.

(56) References Cited

U.S. PATENT DOCUMENTS

| | | | |
|---|---|---|---|
| 8,976,592 B2 * | 3/2015 | Park .................. | G11C 16/28 365/185.17 |
| 2008/0123426 A1 | 5/2008 | Lutze et al. | |

FOREIGN PATENT DOCUMENTS

KR     1020100090386 A    8/2010

\* cited by examiner

*Primary Examiner* — David Lam
(74) *Attorney, Agent, or Firm* — William Park & Associates Ltd.

(57) ABSTRACT

A semiconductor memory device and an operating method of the semiconductor memory device may be provided. The semiconductor memory device may include a plurality of memory strings each having a plurality of memory cells coupled in series between a bit line and a source line. The semiconductor memory device may include a peripheral circuit configured to apply a program voltage, a pass voltage, and a cut-off voltage to the plurality of memory strings and perform a program operation. The semiconductor memory device may include control logic configured to control the peripheral circuit so that the cut-off voltage is applied to memory cells adjacent to a selected memory cell among the plurality of memory cells, wherein the peripheral circuit is controlled such that the cut-off voltage increases.

20 Claims, 8 Drawing Sheets

SEMICONDUCTOR MEMORY DEVICE WITH CUT-OFF VOLTAGE AND OPERATING METHOD THEREOF

CROSS-REFERENCE TO RELATED APPLICATION

The present application claims priority to Korean patent application number 10-2015-0164006 filed on Nov. 23, 2015, the entire disclosure of which is incorporated herein in its entirety by reference.

BACKGROUND

1. Technical Field

Various embodiments of the present disclosure generally relate to an electronic device, and more particularly, to a semiconductor memory device and an operating method thereof.

2. Related Art

Semiconductor memory devices are memory devices embodied using a semiconductor such as silicon (Si), germanium (Ge), gallium arsenide (GaAs), indium phosphide (InP), or the like. Semiconductor memory devices may be classified into volatile memory devices and nonvolatile memory devices.

The volatile memory device is a memory device in which data stored therein is lost when power is interrupted. Representative examples of the volatile memory device include static RAM (SRAM), dynamic RAM (DRAM), synchronous DRAM (SDRAM), etc. The nonvolatile memory device is a memory device which retains data stored therein even when power is interrupted. Representative examples of the nonvolatile memory device include read only memory (ROM), programmable ROM (PROM), electrically programmable ROM (EPROM), electrically erasable programmable ROM (EEPROM), flash memory, phase-change random access memory (PRAM), magnetic RAM (MRAM), resistive RAM (RRAM), ferroelectric RAM (FRAM), etc. Flash memory may be classified into either a NOR type or a NAND type.

SUMMARY

In an embodiment, a semiconductor memory device may be provided. The semiconductor memory device may include a plurality of memory strings each including a plurality of memory cells coupled in series between a bit line and a source line. The semiconductor memory device may include a peripheral circuit configured to apply a program voltage, a pass voltage, and a cut-off voltage to the plurality of memory strings and perform a program operation. The semiconductor memory device may include a control logic configured to control the peripheral circuit so that the cut-off voltage is applied to memory cells adjacent to a selected memory cell among the plurality of memory cells, wherein the peripheral circuit is controlled such that as the selected memory cell is disposed closer to the bit line, the cut-off voltage increases.

In an embodiment, a method of operating a semiconductor memory device may be provided. The method may include providing a memory cell array including a plurality of memory cells vertically stacked and disposed between a bit line and a source line. The method may include applying a pass voltage to the plurality of memory cells; applying a cut-off voltage to memory cells adjacent to a selected memory cell among the plurality of memory cells. The method may include applying a program voltage to the selected memory cell. The method may include selecting a memory cell subsequent to the selected memory cell and re-performing the operation of the semiconductor memory device from the applying of the pass voltage, wherein as a program operation of the selected memory cell is performed earlier in a program sequence, the cut-off voltage is reduced.

In an embodiment, a method of operating a semiconductor memory device may be provided. The method may include providing a memory cell array including first memory cells, a pipe transistor, and second memory cells that are coupled in series between a source line and a bit line. The method may include applying a pass voltage to the first and second memory cells and the pipe transistor. The method may include applying a cut-off voltage to memory cells adjacent to a selected memory cell among the first and second memory cells. The method may include applying a program voltage to the selected memory cell. The cut-off voltage may be variable depending on an address of the selected memory cell.

DETAILED DESCRIPTION

Various embodiments of the present disclosure may be directed to a semiconductor memory device which is capable of controlling a channel local boosting phenomenon such that during a program operation of the semiconductor memory device, a program disturb phenomenon is mitigated, and a method of operating the semiconductor memory device.

Hereinafter, embodiments of the present disclosure will be described below reference to the accompanying drawings.

Advantages and features of the present disclosure, and methods for achieving the same will be cleared with reference to examples of embodiments described later together with the accompanying drawings. Accordingly, the present disclosure is not limited to the following embodiments but embodied in other types. Rather, these embodiments are provided so that the present disclosure will be thorough and complete, and will fully convey the technical spirit of the disclosure to those skilled in the art.

It will be understood that when an element is referred to as being "coupled" or "connected" to another element, it can be directly coupled or connected to the other element or intervening elements may be present therebteween. In the specification, when an element is referred to as "comprising" or "including" a component, it does not preclude another component but may further include other components unless the context clearly indicates otherwise.

Figure 1:
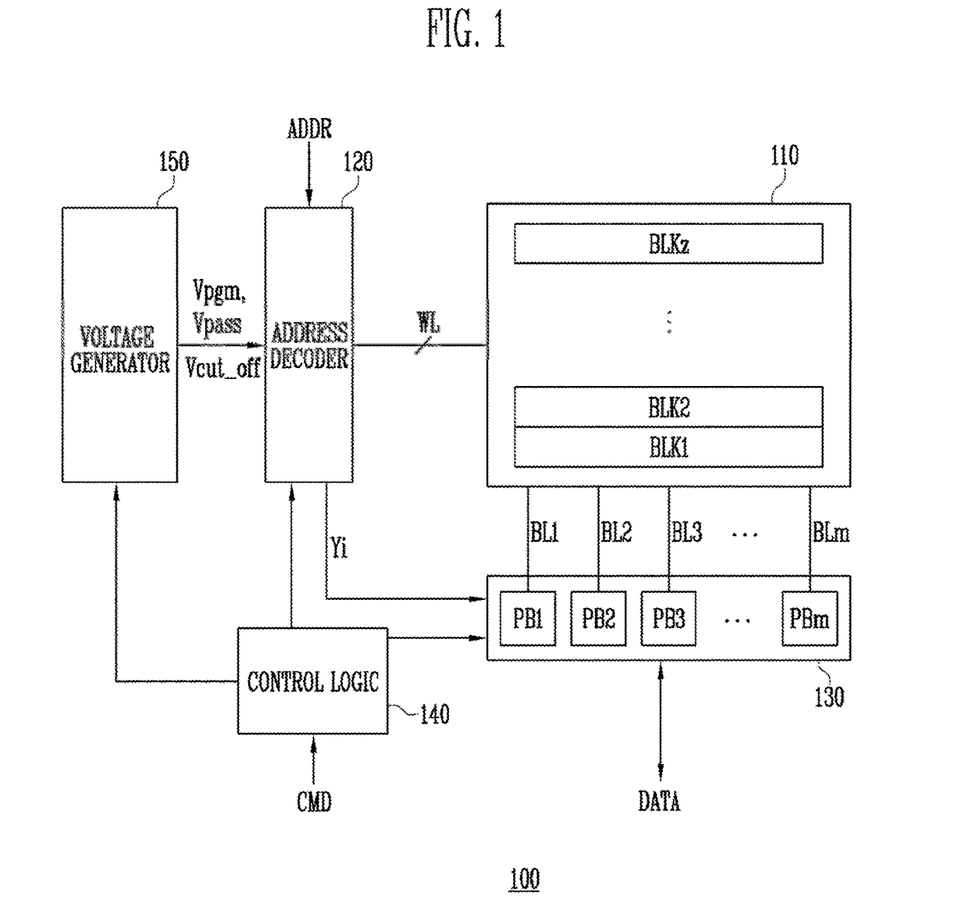
FIG. 1 is a block diagram illustrating a representation of an example of a semiconductor memory device according to an embodiment of the present disclosure.

FIG. 1 is a block diagram illustrating a representation of an example of a semiconductor memory device according to an embodiment of the present disclosure.

Referring to FIG. 1, a semiconductor memory device 100 includes a memory cell array 110, an address decoder 120, a read/write circuit 130, a control logic 140, and a voltage generator 150.

The memory cell array 110 includes a plurality of memory blocks BLK1 to BLKz. The memory blocks BLK1 to BLKz are coupled to the address decoder 120 through word lines WL. The memory blocks BLK1 to BLKz are coupled to the read/write circuit 130 through bit lines BL1 to BLm. Each of the memory blocks BLK1 to BLKz includes a plurality of memory cells. In an embodiment, the plurality of memory cells are nonvolatile memory cells, and in particular, the plurality of memory cells may be charge trap device based nonvolatile memory cells. Memory cells coupled to the same word line among the plurality of memory cells are defined as one page. In other words, the memory cell array 110 is formed of a plurality of pages. Each of the memory blocks BLK1 to BLKz of the memory cell array 110 includes a plurality of memory strings. Each of the memory strings includes a drain select transistor, a plurality of memory cells, and a source select transistor cell which are coupled in series between a bit line and a source line.

The address decoder 120, the read/write circuit 130, and the voltage generator 150 are operated as peripheral circuits for driving the memory cell array 110.

The address decoder 120 is coupled to the memory cell array 110 through the word lines WL. The address decoder 120 is configured to be operated under the control of the control logic 140. The address decoder 120 receives an address ADDR through an input/output buffer (not illustrated) provided in the semiconductor memory device 100.

The address decoder 120 decodes a row address of received addresses ADDR and applies, in a program voltage applying operation, a program voltage Vpgm and a pass voltage Vpass, which are generated from the voltage generator 150, to a plurality of word lines WL of the memory cell array 110 in accordance with the decoded row address.

A program operation of the semiconductor memory device 100 is performed with a page as a unit. Addresses ADDR received in a request for a program operation include a block address, a row address, and a column address. The address decoder 120 selects a corresponding one of the memory blocks and a corresponding one of the word lines in accordance with the block address and the row address. The column address is decoded by the address decoder 120 and provided to the read/write circuit 130.

The address decoder 120 may include a block decoder, a row decoder, a column decoder, an address buffer, etc.

The read/write circuit 130 includes a plurality of page buffers PB1 to PBm. The plurality of page buffers PB1 to PBm are coupled to the memory cell array 110 through the bit lines BL1 to BLm. Each of the page buffers PB1 to PBm temporarily stores data DATA inputted in the program operation and controls potential of a corresponding one of the bit lines BL1 to BLm in accordance with the temporarily stored data. The read/write circuit 130 may be operated under the control of the control logic 140.

The control logic 140 is coupled to the address decoder 120, the read/write circuit 130, and the voltage generator 150. The control logic 140 receives a command CMD through an input/output buffer (not illustrated) of the semiconductor memory device 100. The control logic 140 is configured to control the overall operation of the semiconductor memory device 100 in response to the command CMD.

In a program operation, the control logic 140 controls the address decoder 120 and the voltage generator 150 such that a cut-off voltage Vcut-off is applied to word lines of pages adjacent to a selected page. In the program operation, the control logic 140 controls the voltage generator 150 such that a potential level of the cut-off voltage Vcut-off is adjusted according to an address of the selected page. For example, during a program operation, the control logic 140 controls the voltage generator 150 such that as a program operation of the selected page is performed earlier in a program sequence, the potential level of the cut-off voltage Vcut-off is lowered, and as the program operation of the selected page is performed later, the potential level of the cut-off voltage Vcut-off is raised. The control logic 140 controls the voltage generator 150 in the program operation such that the potential level of the cut-off voltage Vcut-off is adjusted depending on channel widths of memory cells included in the selected page.

In a program operation, the voltage generator 150 generates a program voltage Vpgm, a pass voltage Vpass, and a cut-off voltage Vcut-off under the control of the control logic 140.

Figure 2:
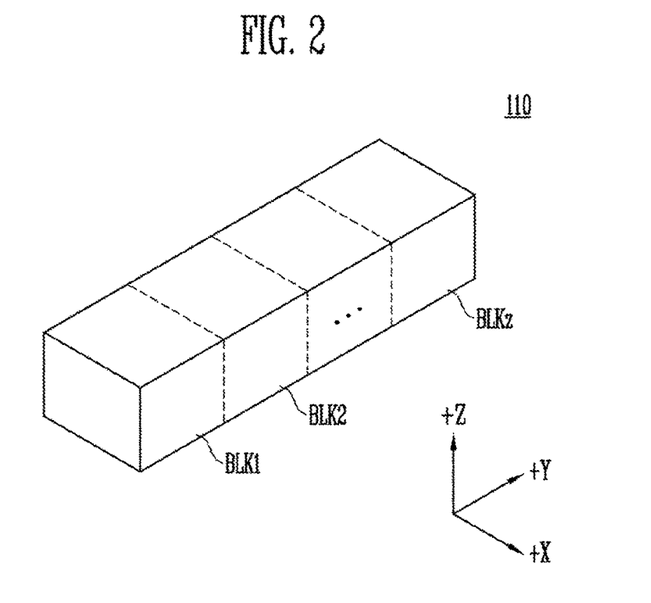
FIG. 2 is a block diagram illustrating a representation of an example of an embodiment of a memory cell array of FIG. 1.

FIG. 2 is a block diagram illustrating a representation of an example of an embodiment of the memory cell array 110 of FIG. 1.

Referring to FIG. 2, the memory cell array 110 includes the plurality of memory blocks BLK1 to BLKz. Each memory block has a three-dimensional structure. Each memory block includes a plurality of memory cells stacked on a substrate. The memory cells are arranged in +X, +Y, and +Z directions. Various embodiments of the structure of each memory block will be described with reference to FIGS. 3 and 7, which will be explained later herein.

Figure 3:
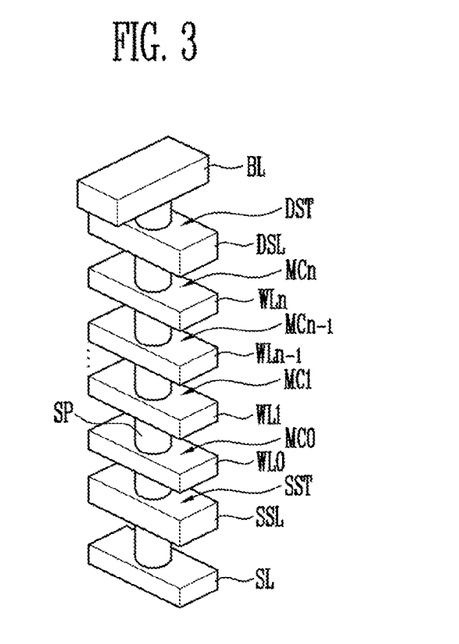
FIG. 3 is a three-dimensional view illustrating a representation of an example of a memory string included in each memory block according to the embodiment of the present disclosure.
Figure 4:
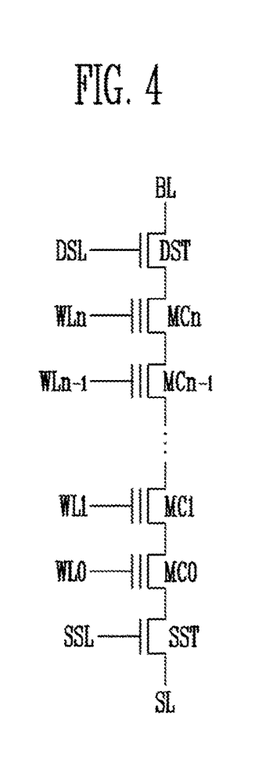
FIG. 4 is a circuit diagram illustrating a representation of an example of the memory string illustrated in FIG. 3.

FIG. 3 is a three-dimensional view illustrating a representation of an example of a memory string included in each memory block according to the present disclosure. FIG. 4 is a circuit diagram illustrating a representation of an example of the memory string.

Referring to FIGS. 3 and 4, a source line SL is formed on a semiconductor substrate. A vertical channel layer SP is formed on the source line SL. An upper portion of the vertical channel layer SP is coupled to a corresponding bit line BL. The vertical channel layer SP may be made of polysilicon. A plurality of conductive layers SSL, WL0 to WLn, and DSL are formed at different heights on the vertical channel layer SP in such a way each of the conductive layers encloses the vertical channel layer SP. Multi-layers (not illustrated) including a charge storage layer is formed on a surface of the vertical channel layer SP. The multi-layers are also disposed between the vertical channel layer SP and the conductive layers SSL, WL0 to WLn, and DSL. The multi-layers may be formed in an ONO structure in which an oxide layer, a nitride layer, and an oxide layer are successively stacked.

The lowermost conductive layer forms a source select line SSL. The uppermost conductive layer forms a drain select line DSL. The conductive layers disposed between the select lines SSL and DSL form the respective word lines WL0 to WLn. In other words, the conductive layers SSL, WL0 to WLn, and DSL are formed in a multi-layer structure on the semiconductor substrate. The vertical channel layer SP passing through the conductive layers SSL, WL0 to WLn, and DSL is vertically coupled between the bit line BL and the source line SL formed on the semiconductor substrate.

The drain select transistor DST is formed on a portion of the uppermost conductive layer DSL that encloses the vertical channel layer SP. The source select transistor SST is formed on a portion of the lowermost conductive layer SSL that encloses the vertical channel layer SP. Memory cells MC0 to MCn are respectively formed on portions of the intermediate conductive layers WL0 to WLn that enclose the vertical channel layer SP.

In this way, the memory string includes the source select transistor SST, the memory cells MC0 to MCn, and the drain select transistor DST, which are vertically coupled to the substrate between the source line SL and the bit line BL. The source select transistor SST electrically couples the memory cells MC0 to MCn to the source line SL depending on a source control voltage applied to the source select line SSL. The drain select transistor DST electrically couples the memory cells MC0 to MCn to the bit line BL depending on a drain control voltage applied to the drain select line DSL.

The vertical channel layer SP of the memory string may have a structure such that the width of the upper portion thereof is greater than that of the lower portion thereof. For example, a channel width of the memory cell MCn may be greater than that of the memory cell MC0. The closer to the drain select transistor DST, the greater the channel width of the memory cell may become.

Figure 5:
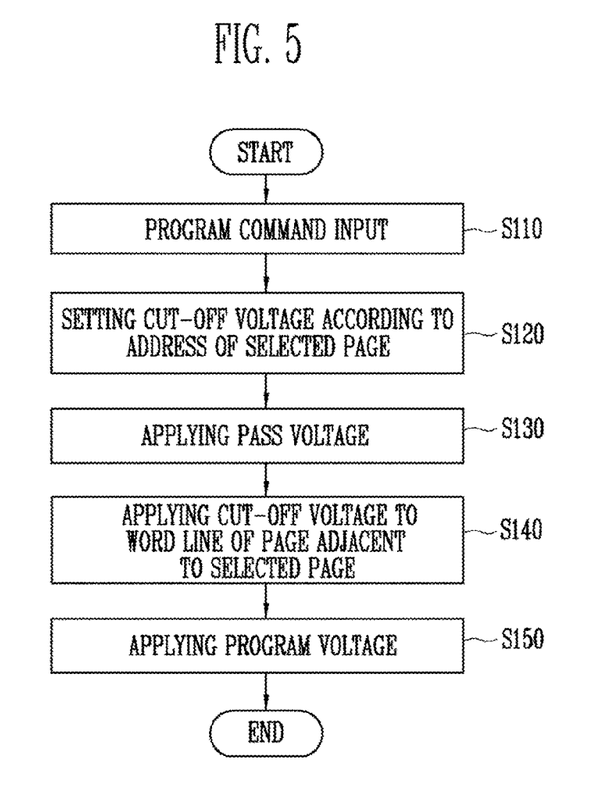
FIG. 5 is a flowchart illustrating a representation of an example of the operation of the semiconductor memory device according to an embodiment of the present disclosure.

FIG. 5 is a flowchart illustrating a representation of an example of the operation of the semiconductor memory device according to an embodiment of the present disclosure.

Figure 6:
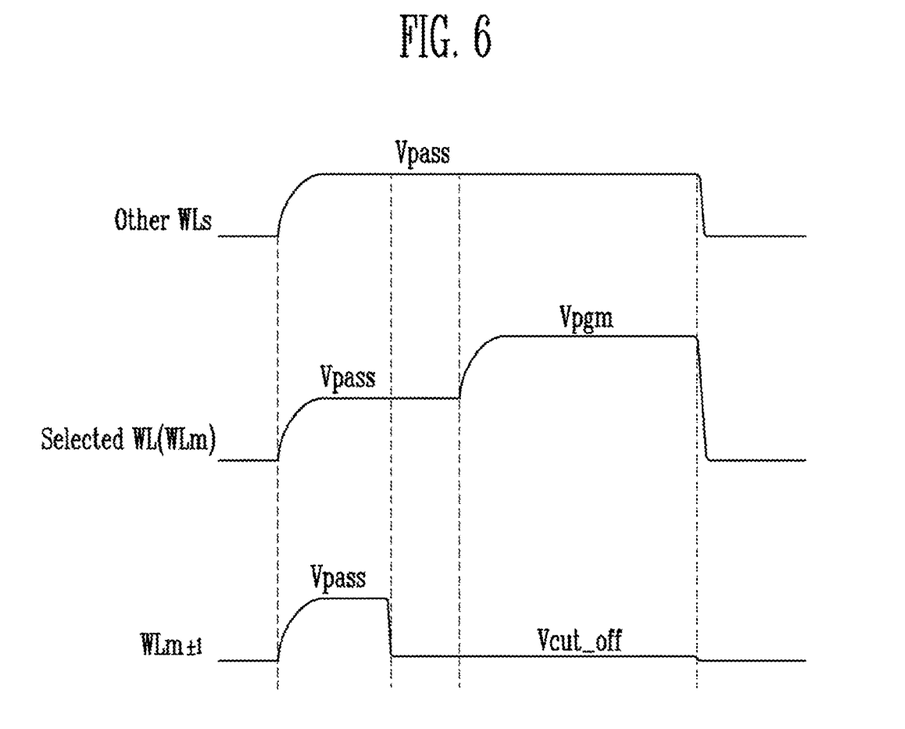
FIG. 6 is a timing diagram of a word line voltage to illustrate a representation of an example of the operation of the semiconductor memory device according to an embodiment of the present disclosure.

FIG. 6 is a timing diagram of a word line voltage to illustrate a representation of an example of the operation of the semiconductor memory device according to an embodiment of the present disclosure.

The operation of the semiconductor memory device according to the embodiment of the present disclosure will be described with reference to FIGS. 1 to 6.

The semiconductor memory device according to an embodiment of the present disclosure may successively program the plurality of memory cells, and an example of programming the memory cells in a sequence from the memory cell MC0 adjacent to the source select transistor SST toward the drain select transistor DST will be described.

1) Program Command Input (S110)

When a command CMD for a program operation of the semiconductor memory device is received by the control logic 140, the control logic 140 controls the read/write circuit 130 so that data DATA to be programmed, which is inputted from the outside, is temporarily stored in the plurality page buffers PB1 to PBm of the read/write circuit 130. Each of the page buffers PB1 to PBm temporarily stores data DATA inputted in the program operation and controls a potential of a corresponding one of the bit lines BL1 to BLm in accordance with the temporarily stored data.

2) Setting a Cut-Off Voltage According to a Selected Page Address (S120)

The control logic 140 selects a page to perform a program operation, and sets a cut-off voltage Vcut-off according to an address of the selected page. When the selected page is a page including the memory cells MC0 coupled to the first word line WL0, this is set as a reference cut-off voltage (for example, 0V), and as the address of the selected page is increased, the potential level of the cut-off voltage Vcut-off may be set to increase by an offset voltage. For instance, when the selected page is a page including the memory cells MC1 coupled to the second word line WL1, the cut-off voltage Vcut-off is set by adding an offset voltage to the reference cut-off voltage. When the selected page is a page including the memory cells MC2 coupled to the third word line WL2, a new cut-off voltage Vcut-off is set by adding an offset voltage to the cut-off voltage Vcut-off set in the preceding selected page (the page corresponding to the word line WL1). As described, the cut-off voltage Vcut-off may be set such that it gradually increases as the program sequence proceeds. Furthermore, different cut-off voltages Vcut-off may be set to the respective pages. Alternatively, adjacent pages may be grouped into a single page group, and different cut-off voltages Vcut-off may be set to corresponding respective groups.

3) Applying a Pass Voltage (S130)

The voltage generator 150 generates a pass voltage Vpass under the control of the control logic 140. The address decoder 120 applies the pass voltage, generated by the voltage generator 150, to the selected word line Selected WLm and the other word lines Other WLs and WLm±1.

4) Applying a Cut-Off Voltage to Word Lines of Pages Adjacent to the Selected Page (S140)

The voltage generator 150 generates a cut-off voltage Vcut-off set at the cut-off voltage setting step (S120), according to the selected page address under the control of the control logic 140. The address decoder 120 applies the cut-off voltage Vcut-off generated by the voltage generator 150 to the word lines WLm±1 of the pages adjacent to the selected page. Thereby, memory cells coupled to the word lines WLm±1 are turned off. That is, the memory cells that are adjacent to both sides of the selected memory cell are turned off. With regard to the channel of the memory string that is formed by the pass voltage Vpass, the memory cells coupled to the word lines WLm±1 are turned off and thus electrically cut off, whereby a local boosting phenomenon is caused in the channel of the memory string by the pass voltage Vpass applied to the other word lines Other WLs.

Here, depending on the potential level of the cut-off voltage Vcut-off applied to the word lines WLm±1 of the adjacent pages, the memory cells may not be completely turned off. That is, a local boosting level of the adjacent channels may be adjusted depending on the potential level of the cut-off voltage Vcut-off.

When the potential level of the cut-off voltage Vcut-off is 0V, the memory cells adjacent to the selected memory cell are turned off by the cut-off voltage Vcut-off, and the channel of the memory string is interrupted on the adjacent memory cells, whereby a local boosting phenomenon is caused. In this case, a band to band tunneling (BTBT) phenomenon may be caused by an electric field generated by a high difference in potential between the cut-off voltage Vcut-off and the program voltage Vpgm applied to the selected memory cell. Thereby, a program disturb phenomenon may be caused. To avoid this, the potential level of the cut-off voltage Vcut-off may be raised. In the program operation, the BTBT phenomenon is intensified as the number of memory cells that perform the program operation is increased. Therefore, the program disturb phenomenon may be mitigated in such a way that as the program operation of the selected page is performed earlier in a program sequence, the potential level of the cut-off voltage Vcut-off is set to be low, and as the program operation of the selected page is performed later, the potential level of the cut-off voltage Vcut-off is set to be high. That is, the potential level of the cut-off voltage Vcut-off may be set to be increased as the address of the selected page is increased.

5) Applying a Program Voltage (S150)

The voltage generator 150 generates a program voltage Vpgm under the control of the control logic 140. The address decoder 120 applies the program voltage Vpgm generated by the voltage generator 150 to the selected word line WLm.

With regard to the method of operating the semiconductor memory device according to an embodiment of the present disclosure, although the normal program operation in which the memory cells are programmed in a sequence from the memory cell MC0 adjacent to the source select transistor SST toward the drain select transistor DST has been described, a reverse program operation in which the memory cells are programmed in a reverse sequence to the above-described sequence. Preferably, the cut-off voltage Vcut-off may be set to be increased as the program operation of the selected page is performed later, in the same manner as that of the above-mentioned program operation method.

Figure 7:
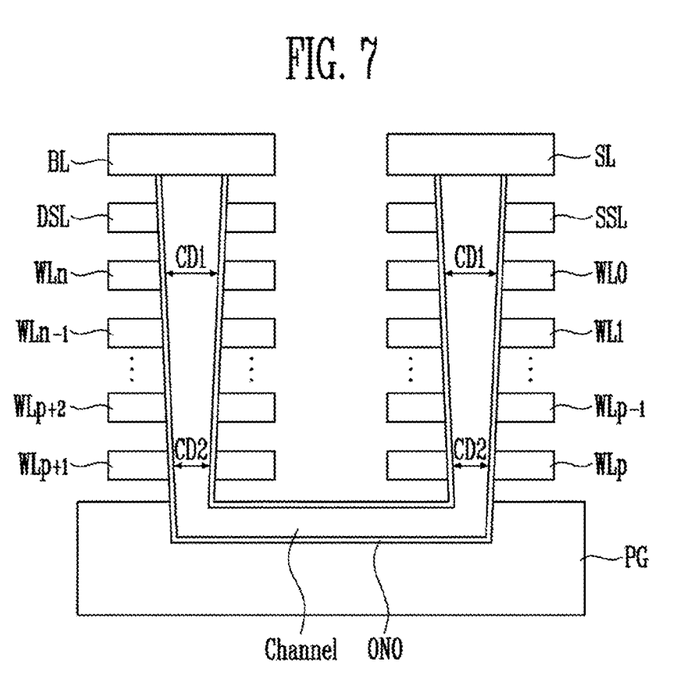
FIG. 7 is a sectional view illustrating a representation of an example of a memory string according to an embodiment of the present disclosure.

FIG. 7 is a sectional view illustrating a representation of an example of a memory string according to an embodiment of the present disclosure.

Figure 8:
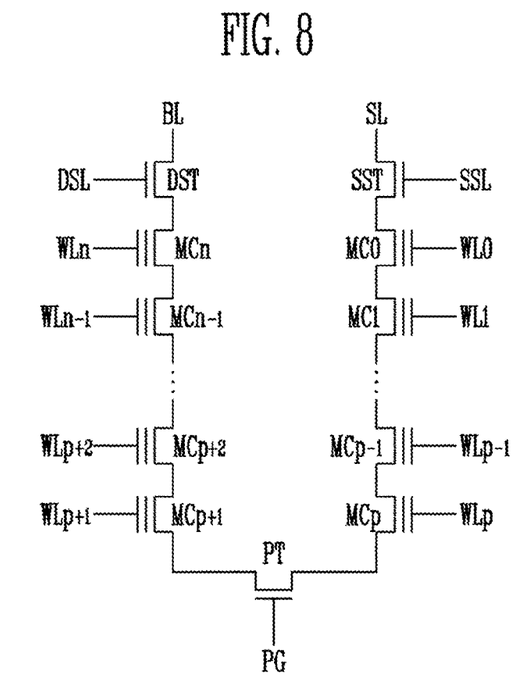
FIG. 8 is a circuit diagram illustrating a representation of an example of the memory string illustrated in FIG. 7.

FIG. 8 is a circuit diagram illustrating a representation of an example of the memory string illustrated in FIG. 7.

FIGS. 7 and 8, the memory string may be formed in a U-shaped channel structure. Both ends of the U-shaped channel are respectively coupled with a bit line BL and a source line SL. A portion of the U-shaped channel that is formed in a pipe gate PG is operated as a pipe transistor PT.

The memory string includes a plurality of word line layers WL0 to WLp and WLp+1 to WLn which are stacked on the pipe gate PG along the U-shaped channel. A drain select line DSL is formed on the end of the U-shaped channel that is coupled with the bit line BL. A source select line SSL is formed on the end of the U-shaped channel that is coupled with the source line SL. The surface of the U-shaped channel may be formed to be enclosed by a memory layer ONO.

The above-mentioned U-shaped channel may be formed in such a way that during a manufacture process, a U-shaped plug hole is formed by etching a plurality of alternately-stacked material layers and then filled with channel material. In this way, the U-shaped channel may be formed such that a width CD1 of each upper end thereof is greater than a width CD2 of each lower end thereof. Thus, in a program operation, depending on a location of a selected memory cell, a local boosting level of the channel may be changed.

Memory cells coupled between the source line SL and the pipe transistor PT may be defined as first memory cells, and memory cells coupled between the pipe transistor PT and the bit line BL may be defined as second memory cells.

The operation of the semiconductor memory device according to an embodiment associated with FIGS. 7 and 8 of the present disclosure will be described with reference to FIGS. 1, 2, and 5 to 8.

The semiconductor memory device according to an embodiment of the present disclosure may successively program the plurality of memory cells, and an example of programming the memory cells in a sequence from the memory cell MC0 adjacent to the source select transistor SST toward the drain select transistor DST will be described.

1) Program Command Input (S110)

When a command CMD for a program operation of the semiconductor memory device is received to the control logic 140, the control logic 140 controls the read/write circuit 130 so that data DATA to be programmed, which is inputted from the outside, is temporarily stored in the plurality page buffers PB1 to PBm of the read/write circuit 130. Each of the page buffers PB1 to PBm temporarily stores data DATA inputted in the program operation and controls potential of a corresponding one of the bit lines BL1 to BLm in accordance with the temporarily stored data.

2) Setting a Cut-Off Voltage According to a Selected Page Address (S120)

The control logic 140 selects a page to perform a program operation, and sets a cut-off voltage Vcut-off according to an address of the selected page. Here, cut-off voltages Vcut-off may be respectively separately set for first memory cells MC0 to MCp and second memory cells MCp+1 to MCn which are separated from each other based on the pipe transistor PT. For example, in the first memory cells MC0 to MCp, when the selected page is a page including the memory cells MC0 coupled to the first word line WL0, this is set as a first reference cut-off voltage (for example, 0V), and as the address of the selected page is increased, the potential level of the cut-off voltage Vcut-off may be set to be increased by an offset voltage. For instance, when the selected page is a page including the memory cells MC1 coupled to the second word line WL1, the cut-off voltage Vcut-off is set by adding an offset voltage to the reference cut-off voltage. When the selected page is a page including the memory cells MC2 coupled to the third word line WL2, a new cut-off voltage Vcut-off is set by adding an offset voltage to the cut-off voltage Vcut-off set in the preceding selected page (the page corresponding to the word line WL1).

In the second memory cells MCp+1 to MCn, when the selected page is a page including the memory cells MCp+1 coupled to the word line WLp+1, this is set as a second reference cut-off voltage, and as the address of the selected page is increased, the potential level of the cut-off voltage Vcut-off may be set to be increased by an offset voltage. For instance, when the selected page is a page including the memory cells MCp+2 coupled to the word line WLp+2, the cut-off voltage Vcut-off may be set by adding an offset voltage to the second reference cut-off voltage. The second reference cut-off voltage may be equal to or higher than the first reference cut-off voltage.

Furthermore, the offset voltage may be changed depending on channel widths of memory cells.

For example, the U-shaped channel may be formed such that the width CD1 of each upper end thereof is greater than the width CD2 of each lower end thereof. Therefore, when a program operation is successively performed for the first memory cells, that is, from the memory cell MC0 to the memory cell MCp, the cut-off voltage Vcut-off is set with the offset voltages that are successively reduced. On the other hand, when a program operation is successively performed for the second memory cells, that is, from the memory cell MCp+1 to the memory cell MCn, the cut-off voltage Vcut-off is set with the offset voltages that are successively increased.

As described above, the cut-off voltages are separately set for the first memory cells and the second memory cells, wherein the cut-off voltages may be set to be gradually increased as the program sequences of the first and second memory cells proceed, and the offset voltage may vary such that the cut-off voltage Vcut-off is increased as the channel widths of the memory cells are increased. Furthermore, different cut-off voltages Vcut-off may be set to the respective pages. Alternatively, adjacent pages may be grouped into a single page group, and different cut-off voltages Vcut-off may be set to corresponding respective groups.

3) Applying a Pass Voltage (S130)

The voltage generator 150 generates a pass voltage Vpass under the control of the control logic 140. The address decoder 120 applies the pass voltage, generated by the voltage generator 150, to the selected word line Selected WLm and the other word lines Other WLs and WLm±1. In this case, the pass voltage Vpass may also be applied to the pipe transistor PT.

4) Applying a Cut-Off Voltage to Word Lines of Pages Adjacent to the Selected Page (S140)

The voltage generator 150 generates a cut-off voltage Vcut-off set at the cut-off voltage setting step (S120), according to the selected page address under the control of the control logic 140. The address decoder 120 applies the cut-off voltage Vcut-off generated by the voltage generator 150 to the word lines WLm±1 of the pages adjacent to the selected page. Thereby, memory cells coupled to the word lines WLm±1 are turned off. That is, the memory cells that are adjacent to both sides of the selected memory cell are turned off. With regard to the channel of the memory string that is formed by the pass voltage Vpass, the memory cells coupled to the word lines WLm±1 are turned off and thus electrically cut off, whereby a local boosting phenomenon is caused in the channel of the memory string by the pass voltage Vpass applied to the other word lines Other WLs.

Here, depending on the potential level of the cut-off voltage Vcut-off applied to the word lines WLm±1 of the adjacent pages, the memory cells may not be completely turned off. That is, depending on the potential level of the cut-off voltage Vcut-off, a local boosting level of the adjacent channels may be adjusted. As the potential level of the cut-off voltage Vcut-off is increased, the local boosting level of the channel is decreased, whereby a program disturb phenomenon caused by a BTBT phenomenon may be restrained.

Furthermore, as the channel widths of the memory cells adjacent to the selected memory cell are reduced, the local boosting potential level becomes high. In other words, as the selected page is disposed closer to the pipe transistor PT, the local boosting potential level is lowered. In this embodiment of the present disclosure, when the program operation is successively performed for from the memory cell MC0 to the memory cell MCp, the cut-off voltage Vcut-off is set with offset voltages that are successively reduced. On the other hand, when a program operation is successively performed for from the memory cell MCp+1 to the memory cell MCn, the cut-off voltage Vcut-off is set with offset voltages that are successively increased.

As described above, the cut-off voltage Vcut-off may be set such that it is gradually increased as the program sequence proceeds. A program disturb phenomenon caused by a BTBT phenomenon may be restrained by varying the offset voltage such that the cut-off voltage Vcut-off is increased depending on the channel widths of the memory cells.

5) Applying a Program Voltage (S150)

The voltage generator 150 generates a program voltage Vpgm under the control of the control logic 140. The address decoder 120 applies the program voltage Vpgm generated by the voltage generator 150 to the selected word line WLm.

Figure 9:
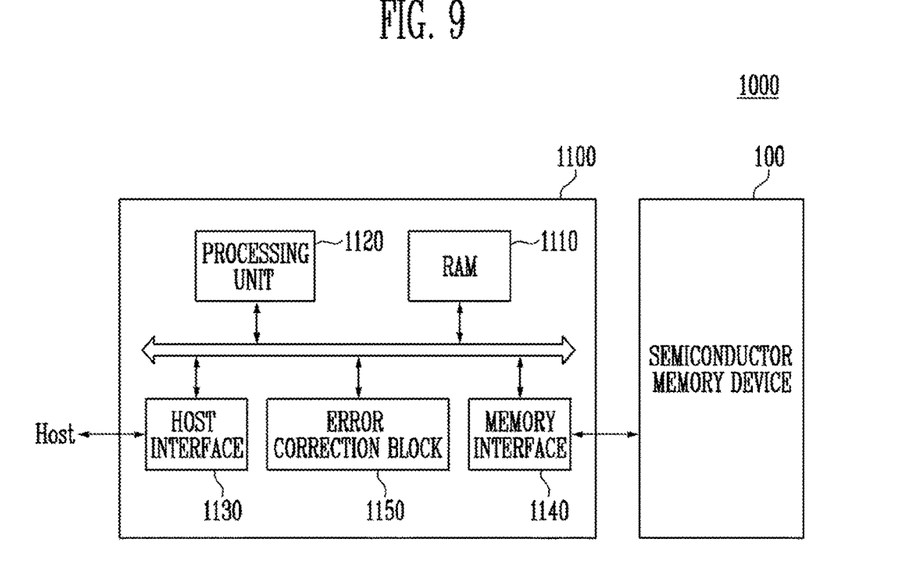
FIG. 9 is a block diagram illustrating a representation of an example of a memory system including the semiconductor memory device of FIG. 1.

FIG. 9 is a block diagram illustrating a representation of an example of a memory system including a semiconductor memory device of FIG. 1.

Referring to FIG. 9, the memory system 1000 includes the semiconductor memory device 100 and a controller 1100.

The semiconductor memory device 100 may be configured and operated in the same manner as those of the semiconductor memory devices described with reference to FIG. 1. Hereinafter, the repetitive explanations will be omitted.

The controller 1100 is coupled to a host and the semiconductor memory device 100. In response to a request from the host, the controller 1100 accesses the semiconductor memory device 100. For example, the controller 1100 is configured to control read, write, erase, and background operations of the semiconductor memory device 100. The controller 1100 is configured to provide an interface between the host and the semiconductor memory device 100. The controller 1100 is configured to drive firmware for controlling the semiconductor memory device 100.

The controller 1100 includes a RAM (random access memory) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host, and a buffer memory between the semiconductor memory device 100 and the host. The processing unit 1120 controls an entire operation of the controller 1100. In addition, the controller 1100 may temporarily store program data provided from the host during the write operation.

The host interface 1130 includes a protocol for performing data exchange between the host and the controller 1100. In an example of an embodiment, the controller 1200 is configured to communicate with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or NOR interface.

The error correction block 1150 uses an error correction code (ECC) to detect and correct an error in data received from the semiconductor memory device 100. The processing unit 1120 may adjust a read voltage according to an error detection result from the error correction block 1150, and control the semiconductor memory device 100 to perform re-reading. In an example of an embodiment, the error correction block may be provided as an element of the controller 1100.

The controller 1100 and the semiconductor memory device 100 may be integrated into a single semiconductor device. In an example of an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a PC card (PCMCIA, personal computer memory card international association), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host coupled to the memory system 2000 may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, an RFID device, one of various elements for forming a computing system, or the like.

In an example of an embodiment, the semiconductor memory device 100 or the memory system 1000 may be embedded in various types of packages. For example, the semiconductor memory device 100 or the memory system 1000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 10:
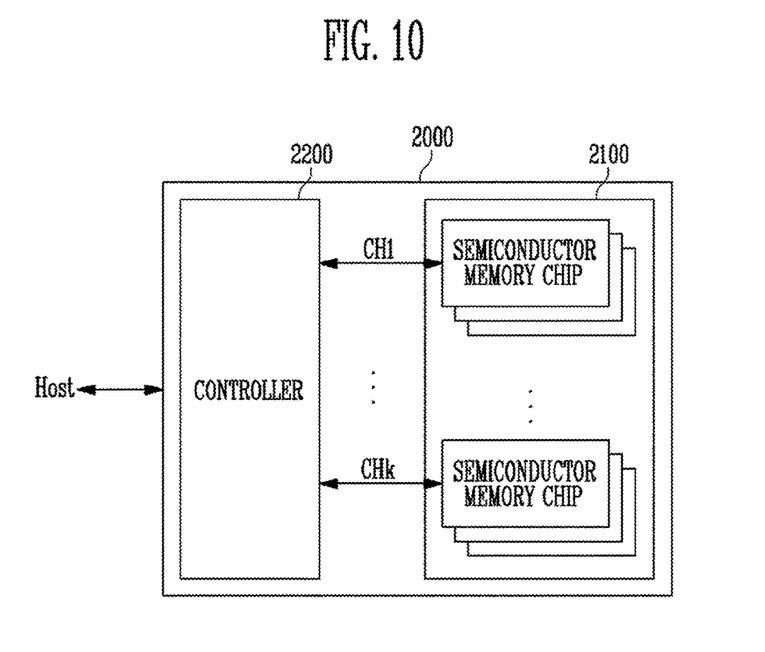
FIG. 10 is a block diagram illustrating a representation of an example of an application example of the memory system of FIG. 9.

FIG. 10 is a block diagram illustrating a representation of an example of an application example of the memory system of FIG. 9.

Referring FIG. 10, the memory system 2000 includes a semiconductor memory device 2100 and a controller 2200. The semiconductor memory device 2100 includes a plurality of memory chips. The semiconductor memory chips are divided into a plurality of groups.

Referring to FIG. 10, it is illustrated that each of the plurality of groups communicates with the controller 2200 through a corresponding one of first to k-th channels CH1 to CHk. Each semiconductor memory chip is configured and operated in the same manner as those of an embodiment of the semiconductor memory devices 100 described with reference to FIG. 1.

Each group communicates with the controller 2200 through one common channel. The controller 2200 has the same configuration as that of the controller 1100 described with reference to FIG. 9 and is configured to control a plurality of memory chips of the semiconductor memory device 2100 through the plurality of channels CH1 to CHk.

Figure 11:
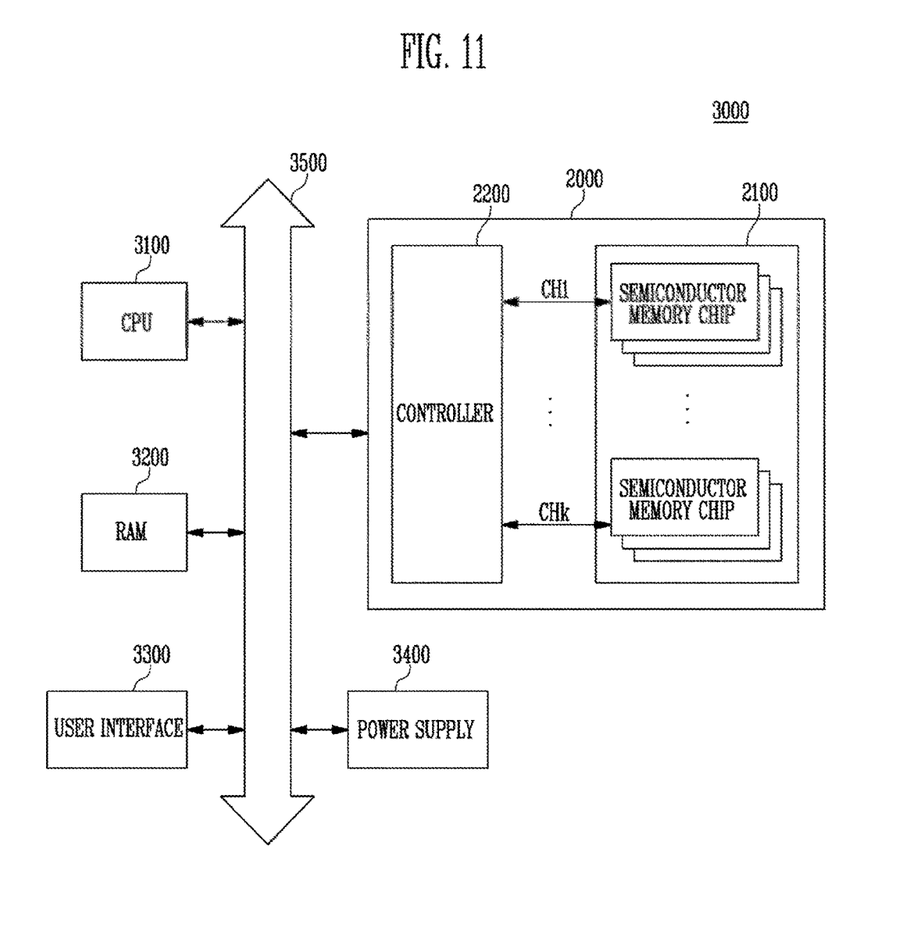
FIG. 11 is a block diagram illustrating a representation of an example of a computing system including the memory system illustrated with reference to FIG. 10.

FIG. 11 is a block diagram illustrating a representation of an example of a computing system including a memory system illustrated with reference to FIG. 10.

Referring to FIG. 11, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

Referring to FIG. 11, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

Referring to FIG. 11, the memory system 2000 described with reference to FIG. 10 is illustrated as being provided. However, the memory system 2000 may be replaced with the memory system 1000 described with reference to FIG. 9. As an embodiment, the computing system 3000 may include all the memory systems 1000 and 2000 described with reference to FIGS. 10 and 9.

According to the present disclosure, in a program operation of a semiconductor memory device, a program disturb phenomenon can be mitigated by controlling a channel local boosting level.

While the examples of embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A semiconductor memory device comprising:
 a plurality of memory strings each including a plurality of memory cells coupled in series between a bit line and a source line;
 a peripheral circuit configured to apply a program voltage, a pass voltage, and a cut-off voltage to the plurality of memory strings and perform a program operation; and
 a control logic configured to control the peripheral circuit so that the cut-off voltage is applied to memory cells adjacent to a selected memory cell among the plurality of memory cells, wherein the peripheral circuit is controlled such that as the selected memory cell is disposed closer to the bit line, the cut-off voltage increases.

2. The semiconductor memory device according to claim 1,
 wherein the control logic successively selects the plurality of memory cells and performs the program operation, wherein as a program sequence proceeds, the cut-off voltage increases.

3. The semiconductor memory device according to claim 1,
 wherein the peripheral circuit applies the pass voltage to the plurality of memory cells and then applies the cut-off voltage to the memory cells adjacent to the selected memory cell so that the memory cells adjacent to the selected memory cell are turned off and a channel is locally boosted.

4. The semiconductor memory device according to claim 1,
wherein the control logic controls the peripheral circuit and increases the cut-off voltage, wherein the cut-off voltage increases by an offset voltage.

5. The semiconductor memory device according to claim 4,
wherein the offset voltage is variable depending on channel widths of the plurality of memory cells.

6. The semiconductor memory device according to claim 4,
wherein the offset voltage is reduced as channel widths of the plurality of memory cells are reduced.

7. A method of operating a semiconductor memory device, comprising:
providing a memory cell array including a plurality of memory cells vertically stacked and disposed between a bit line and a source line;
applying a pass voltage to the plurality of memory cells;
applying a cut-off voltage to memory cells adjacent to a selected memory cell among the plurality of memory cells;
applying a program voltage to the selected memory cell; and
selecting a memory cell subsequent to the selected memory cell and re-performing the operation of the semiconductor memory device from the applying of the pass voltage,
wherein as a program operation of the selected memory cell is performed earlier in a program sequence, the cut-off voltage is reduced.

8. The method according to claim 7,
wherein the subsequent memory cell is, during a normal program operation, a memory cell that is adjacent to the selected memory cell in a direction toward the bit line, and during a reverse program operation, a memory cell that is adjacent to the selected memory cell in a direction toward the source line.

9. The method according to claim 7,
wherein the cut-off voltage turns off the memory cells adjacent to the selected memory cell and causes a local boosting phenomenon of a channel.

10. The method according to claim 9,
wherein as the cut-off voltage increases, a boosting level of the channel is reduced.

11. The method according to claim 7,
wherein the plurality of memory cells are vertically stacked on a semiconductor substrate, and
wherein as the memory cells are disposed closer to the semiconductor substrate and are lowered in position, channel widths of the memory cells are reduced.

12. The method according to claim 11,
wherein the cut-off voltage increases by an offset voltage, and the offset voltage varies depending on the channel widths of the memory cells.

13. The method according to claim 12,
wherein the offset voltage is reduced as the channel widths of the memory cells are reduced.

14. A method of operating a semiconductor memory device, comprising:
providing a memory cell array including first memory cells, a pipe transistor, and second memory cells that are coupled in series between a source line and a bit line;
applying a pass voltage to the first and second memory cells and the pipe transistor;
applying a cut-off voltage to memory cells adjacent to a selected memory cell among the first and second memory cells; and
applying a program voltage to the selected memory cell,
wherein the cut-off voltage is variable depending on an address of the selected memory cell.

15. The method according to claim 14,
wherein the memory cell array is configured such that the first and second memory cells are successively programmed according to an address sequence.

16. The method according to claim 14,
wherein as the address of the selected memory cell is increased, the cut-off voltage increases by an offset voltage.

17. The method according to claim 16,
wherein the first and second memory cells are stacked on a semiconductor substrate in a U-shaped structure, and
wherein as the memory cells are disposed closer to the pipe transistor, channel widths of the memory cells are reduced.

18. The method according to claim 17, wherein the offset voltage is reduced as the channel widths of the memory cells are reduced.

19. The method according to claim 14,
wherein the cut-off voltage increases by an offset voltage as the address is increased, wherein in the first memory cells disposed between the source line and the pipe transistor, as the address is increased, the offset voltage is reduced.

20. The method according to claim 14,
wherein the cut-off voltage increases by an offset voltage as the address is increased, wherein in the second memory cells disposed between the bit line and the pipe transistor, as the address is increased, the offset voltage is increased.

* * * * *